United States Patent
Schroeder et al.

(10) Patent No.: US 7,062,840 B2
(45) Date of Patent: Jun. 20, 2006

(54) METHOD FOR FORMING PERMANENT MAGNET TARGETS FOR POSITION SENSORS

(75) Inventors: Thaddeus Schroeder, Rochester Hills, MI (US); Shih-Chia Chang, Bloomfield Hills, MI (US); Lorenzo Guadalupe Rodriguez, El Paso, TX (US)

(73) Assignee: Delphi Technologies, Inc., Troy, MI (US)

(*) Notice: Subject to any disclaimer, the term of this patent is extended or adjusted under 35 U.S.C. 154(b) by 163 days.

(21) Appl. No.: 10/372,750

(22) Filed: Feb. 24, 2003

(65) Prior Publication Data

US 2004/0164730 A1 Aug. 26, 2004

(51) Int. Cl.
*H01F 7/06* (2006.01)
*H01F 41/14* (2006.01)
*C25D 5/02* (2006.01)

(52) U.S. Cl. .................. 29/607; 29/604; 29/602.1; 29/603.07; 205/89; 205/90; 205/119; 427/128; 427/131; 428/900

(58) Field of Classification Search ............ 29/603.07, 29/603.13, 603.14, 603.23, 603.25, 602.1, 29/846, 604, 607; 205/89, 90, 119; 427/116, 427/128, 131, 132; 430/315; 428/900
See application file for complete search history.

(56) References Cited

U.S. PATENT DOCUMENTS

| | | | |
|---|---|---|---|
| 3,619,285 A * | 11/1971 | Feldstein | ................ 430/315 X |
| 4,670,316 A * | 6/1987 | Kryder | ................... 428/900 X |
| 4,835,467 A | 5/1989 | Gokhale | |
| 4,924,696 A | 5/1990 | Schroeder et al. | |
| 5,427,675 A * | 6/1995 | Toyama et al. | ......... 205/119 X |
| 5,731,702 A | 3/1998 | Schroeder et al. | |
| 5,754,042 A | 5/1998 | Schroeder et al. | |
| 6,201,466 B1 | 3/2001 | Schroeder | |
| 6,218,080 B1 * | 4/2001 | Wu et al. | ............ 29/603.07 X |
| 6,304,078 B1 | 10/2001 | Jarrard et al. | |
| 6,310,473 B1 | 10/2001 | Zhao | |
| 6,469,497 B1 | 10/2002 | Schroeder | |
| 6,498,482 B1 | 12/2002 | Schroeder | |

FOREIGN PATENT DOCUMENTS

JP 62-216110 * 11/1986 ................. 427/131

* cited by examiner

*Primary Examiner*—A. Dexter Tugbang
(74) *Attorney, Agent, or Firm*—Jimmy L. Funke

(57) ABSTRACT

A process for forming magnetic targets for position and speed sensors, and magnetic targets formed according to the process. The targets are formed on a conductor-clad substrate by first applying a layer of photoresist material and then patterning and etching the photoresist to form trenches defining the shape and dimensions of the targets. Magnetic material is formed in the trenches and magnetized to form the targets.

12 Claims, 8 Drawing Sheets

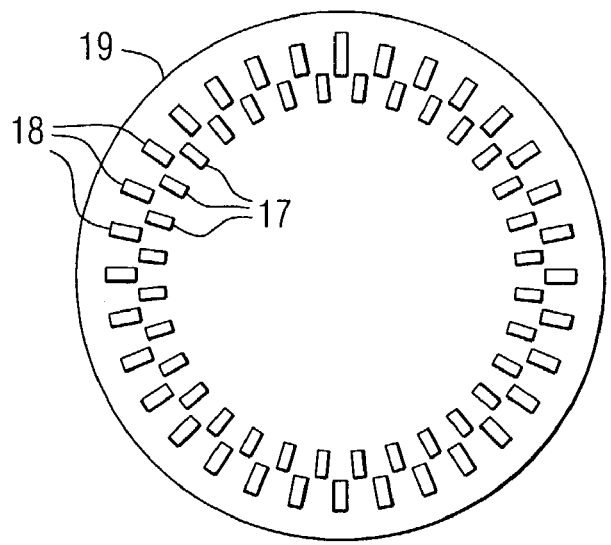
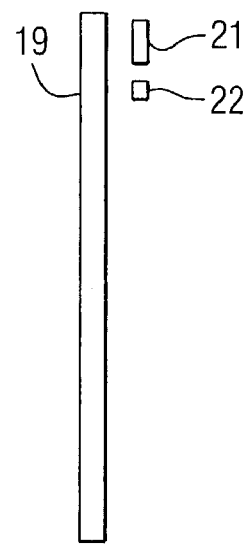
FIG. 4A   FIG. 4B
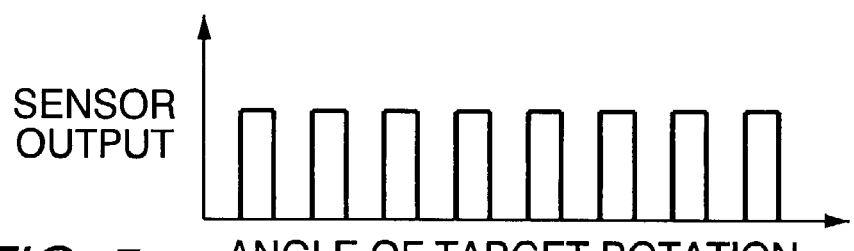
FIG. 5
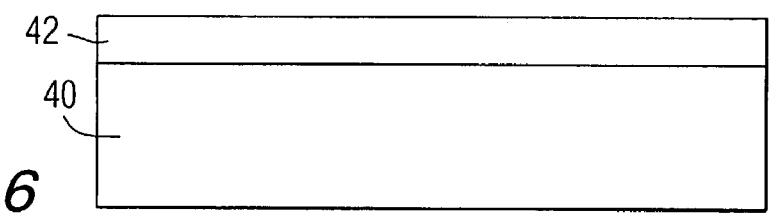
FIG. 6
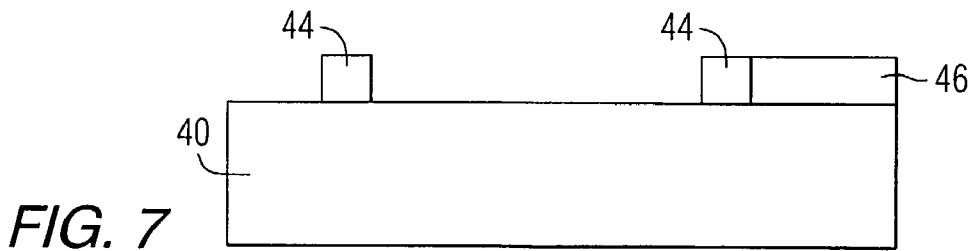
FIG. 7

METHOD FOR FORMING PERMANENT MAGNET TARGETS FOR POSITION SENSORS

TECHNICAL FIELD

The present invention relates generally to position sensors, and more specifically to a method for forming permanent magnet targets for position sensors that provide the required degree of accuracy and resolution of the sensed position, and target apparatus formed thereby.

BACKGROUND OF THE INVENTION

Position sensors monitor the position or motion of a first mechanical component relative to a second mechanical component, by producing an electrical signal that varies as a function of the relative position of the two components. The relative speed of the two components can also be determined by taking the time derivative of the position Electrical position sensors are an important part of innumerable products, and are useful for determining the status of various automotive actuations and processes that involve either linear or angular displacement. For example, the position of an adjustable automotive seat can be determined by sensing devices mounted in the movable seat frame and the fixed seat guiding rails. The position and the angular velocity of the automotive engine crankshaft can also be determined by the appropriate placement of position sensing devices.

One prior art position sensor, a contacting position sensor, requires physical contact between a signal generator and a sensing element to produce the electrical signal representative of position. Contacting position sensors typically consist of a potentiometer responsive to the signal generator and mechanically responsive to the component position, such that the output electrical signals vary as a function of the component's position. Motion-induced contact wear limits the durability of the contact-type position sensors.

Non-contact magnetic type position sensors determine position by measuring changes in a magnetic field. Ferromagnetic material disposed on a moving object passes through a constant magnetic field, modulating the field in accordance with the object's position. One example of such a magnetic sensor includes a ferromagnetic target wheel attached to a rotating axle, the speed and/or position of which is to be determined. In one exemplary embodiment the target wheel comprises a plurality of ferromagnetic teeth defining slots therebetween. The constant magnetic field is produced by a stationary biasing magnet (conventionally a permanent magnet) positioned adjacent to the periphery of the target wheel. A magnetic field sensitive device, such as a magnetoresistor is mounted on the stationary magnet for measuring the magnetic field developed by the stationary magnetic, as modulated by the target wheel ferromagnetic teeth. As the wheel rotates the teeth pass adjacent the stationary magnet, changing the reluctance of the magnetic circuit and in turn varying the magnetic flux density of the magnetic field produced by the stationary magnet. These variations are sensed by the magnetoresistor and manifested as variations in the resistance thereof.

Electronic circuitry responsive to the magnetoresistor produces an analog signal that varies in response to the magnetic field flux density variations. Thus a voltage signal in the form of a DC-biased waveform is produced. The waveform characteristics correspond to the shape and spacing of the teeth. When the signal exceeds a predetermined threshold, a tooth in the wheel has been detected adjacent the magnetoresistor. By appropriately spacing the teeth along the target wheel, the angular position of the rotating shaft can be determined. The angular velocity can also be determined as the rate of change of the position. It is known that the resistance of the magnetoresistor, and thus the position accuracy of such a device, is affected by the temperature, the air gap, magnet aging and the positional accuracy of the teeth relative to the rotating shaft.

A Hall effect device can be used in lieu of a magnetoresistor to sense the changing magnetic field and provide an output signal in response thereto. As is known, a Hall effect device comprises a current-carrying conductor that when placed in a magnetic field such that the magnetic field flux lines are perpendicular to the direction of current flow, generates a voltage across the device that is perpendicular to both the direction of current flow and the magnetic flux lines. Thus the Hall effect voltage, which is a function of the magnetic field flux density, serves as a position indicator for a ferromagnetic target.

Whether a magnetoresistor or a Hall effect device is utilized to sense the magnetic field and thus the object position, the position sensor must be accurate, in that it must produce an electrical signal based upon the measured position. An inaccurate position sensor hinders the proper position evaluation and control of the moving component. A position sensor must also be sufficiently precise in its measurement, although the degree of precision required depends upon the specific application. For some applications, only a rough indication of position is necessary. For instance, an indication of whether a valve is substantially opened or closed may be sufficient in some situations. In other applications a more precise indication of the valve position may be required. The position sensor must also be sufficiently durable for the environment in which it is placed. For example, a position sensor used on an automotive engine valve will experience almost constant movement while the automobile is in operation. The position sensor must be constructed of mechanical and electrical components that allow it to remain sufficiently accurate and precise during its projected lifetime, despite considerable mechanical vibrations and thermal extremes and gradients.

The ferromagnetic targets discussed above are typically large and heavy structures, e.g., gears and slotted disks, manufactured by machining, stamping, blanking, powder metal technology, etc. These manufacturing methods are not only expensive, but are also not suitable for manufacturing targets with fine features and complex geometries that are required for high-accuracy small target sensors. Asymmetries in the placement of the teeth in a target wheel or changes in gap distance as the target wheel rotates cause inaccuracies in position determination.

Targets with precise features are particularly needed in state-of-the-art continuous linear and angular position sensors. Such continuous sensors determine position continuously over a range of values, such as angular rotation between 0° to 120°. By comparison, the toothed wheel sensors described above provide discrete position indications when a tooth passes adjacent the field sensing element. The continuous sensors employ a single shaped target where the shape is designed to produce continuous variations in the magnetic field as the target moves relative to the sensor. A spiral shape is one example of a continuous target. Although it is possible to manufacture precise continuous sensors using the prior art techniques of machining, stamping, etc. described above, precision equipment is required and thus the cost for such sensors is high.

One technique for forming precise ferromagnetic sensor targets is described and claimed in the commonly-owned patent application entitled, Method for Forming Ferromagnetic Targets for Position Sensors, filed on Aug. 6, 2002, and assigned application Ser. No. 10/214,047. According to this method, photolithographic techniques allow for the formation of features as small as 0.1 mm by 0.1 mm, and up to about 1 mm thick for use with either discrete target or continuous target sensors. The magnetic field variations caused by targets with these dimensions can be sensed across air gaps in the range of about 0.25 to 0.5 mm, a range that is typical for high-accuracy position and speed sensors employed in most automotive systems.

SUMMARY OF THE INVENTION

The present invention teaches a method for manufacturing high accuracy permanent magnet targets for position and speed sensors using conventional printed circuit board manufacturing processes to produce precisely located, shaped and dimensioned target tracks.

The target comprises a conductive layer disposed on an insulator substrate. A photoresist layer is formed over the conductive layer, and patterned and etched to form a trench therein. The photoresist trench is filled with a material that is subsequently magnetized to form the target track.

The target is employed with a magnetic field sensor that produces an output signal representative of the position of the magnetic field (without the use of a bias magnet as required by the prior art), which is in turn representative of the position of the target track. The precision of the position detection is improved by the target track's straight vertical sidewalls and the precise positioning of the target resulting from use of the photolithographic process.

BRIEF DESCRIPTION OF THE DRAWINGS

The present invention will now be described, by way of example, with reference to the accompanying drawings in which

FIGS. 4A and 4B illustrate another embodiment of a sensor target;

FIG. 5 illustrates the sensor output for the sensor target of FIG. 4;

FIGS. 6 through 11 illustrate the processing steps for manufacturing a sensor target, such as the sensor target of FIG. 1, according to the teachings of a first embodiment of the present invention;

DESCRIPTION OF THE PREFERRED EMBODIMENT

Before describing in detail the particular method for forming targets for position and speed sensors and targets formed according to said methods in accordance with the teachings of the present invention, it should be observed that the present invention resides primarily in a novel and non-obvious combination of hardware elements and process steps related to forming said targets. Accordingly, the hardware elements and method steps have been represented by conventional elements in the specification and the drawings, showing only those specific details that are pertinent to the present invention, so as not to obscure the disclosure with structural details that will be readily apparent to those skilled in the art having the benefit of the description herein.

Advantageously, according to the teachings of the present invention, the target includes permanent magnetic material in lieu of the prior art ferromagnetic material. The magnetic field sensing can be performed by a Hall effect device, a magnetoresistor, etc., from which the target position information is derived. However, the prior art bias magnet is not required, avoiding the cost of packaging the magnetic sensing element with the bias magnet and reducing the size of the sensing assembly. State-of-the-art position and speed sensors providing the required accuracy and resolution of the target position can be formed according to the present invention. Each target geometry can be designed for the intended application and must be formed with a sufficient quantity of magnetic material for sensing by conventional magnetic sensing devices, taking into consideration the air gap dimensions in use in many automotive and industrial applications.

According to prior art techniques, the formation of permanent magnet targets can be costly and is generally limited to simple geometries formed from discrete multipole magnets or bulk permanent magnets. These techniques are not capable of satisfying the high accuracy requirements of today's state-of-the-art position and speed sensors.

Figure 1:
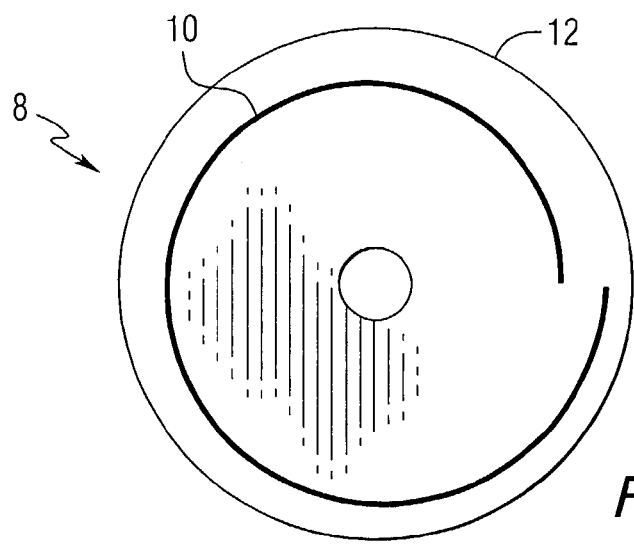
FIG. 1 illustrates a sensor target constructed according to the teachings of the present invention.

FIG. 1 illustrates a target 8 comprising a continuous magnetic target track 10 formed of a magnetic material on a copper-clad substrate material 12. In one embodiment, the completed assembly is coated with a passivation layer to protect the target track 10 from degradation caused by environmental effects. When such a magnetic target track is formed according to the teachings of the present invention, the accuracy and precision obtained is better than that available using the prior art methods.

Figures 2A, 2B:
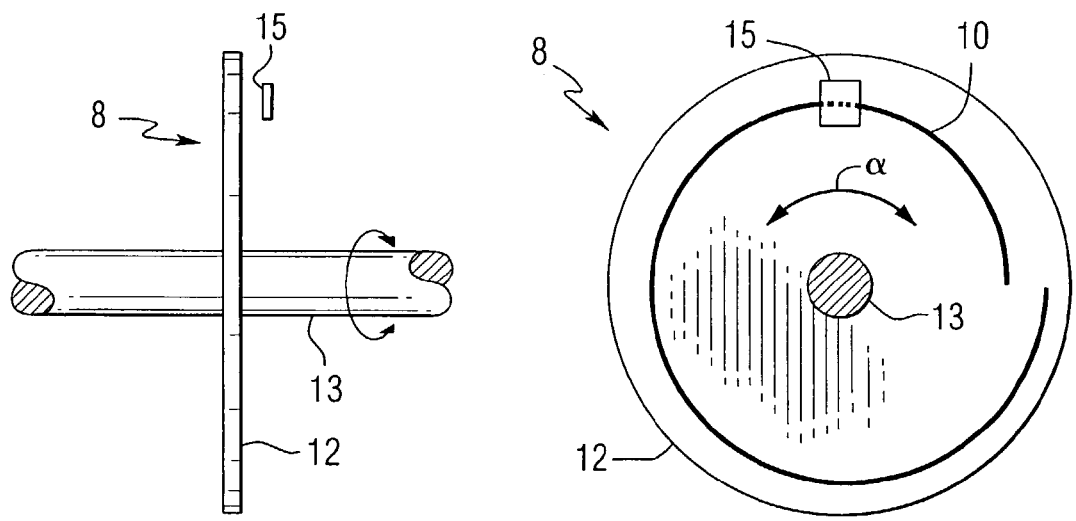
FIGS. 2A and 2B illustrate an application of the sensor target of FIG. 1.
Figure 3:
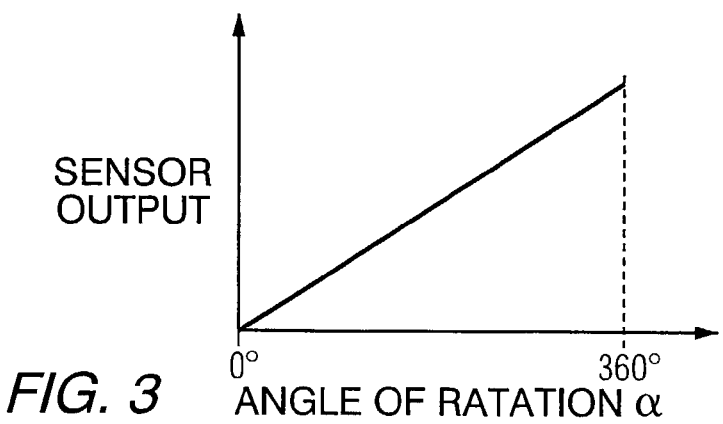
FIG. 3 illustrates the sensor output for the sensor target of FIGS. 2A and 2B.

An application of the target 8 for determining the angular position of a rotating shaft 13 to which the target 8 is attached, is illustrated in FIGS. 2A and 2B. In particular, these Figures indicate an angular sensor that employs the spiral magnetic target track 10 to generate an output signal proportional to the angle α, as illustrated in FIG. 3. A magnetic field sensor 15, such as a Hall effect device or a magnetoresistor, is mounted adjacent the target 8 for sensing the magnetic field of the spiral magnetic target track 10.

By way of example, as shown in FIG. 3, the spiral magnetic target track 10 provides an output that is a linear function of the angle of rotation α. In another embodiment, the output value can be obtained from a microprocessor-controlled lookup table, where the index into the table is the angular position. Because precision targets can be formed according to the teachings of the present invention, in yet another embodiment the look-up table and the microprocessor are unnecessary, as the desired relationship between the target track position and the sensor output value can be provided directly by the magnetic field sensor 15 by appropriate design of the shape and dimensions of the target track 10.

FIGS. 4A and 4B illustrate another embodiment of a position sensor to which the teachings of the present invention can be applied. In FIG. 4A planar complementary magnetic targets 17 and 18 are mounted on a target disk 19. The magnetic field of the targets 17 and 18, is sensed by magnetic field sensors 21 and 22, respectively, shown in the side view of FIG. 4B. Due to the discrete configuration of the targets 17 and 18, the sensor output as a function of target rotation is a series of pulses as illustrated in FIG. 5.

FIGS. 6 through 11 illustrate the process steps according to the present invention for forming magnetic targets such as the spiral magnetic target track 10 and the complementary magnetic target tracks 17 and 18 described above. Generally, the process employs conventional printed circuit board processing steps with variations to accommodate the formation of the target tracks comprising magnetically hard material. Magnetically hard materials exhibit a high coercivity (a measure of the opposition to the permanent magnetization or demagnetization of the material). A very strong magnetizing force must be supplied to the magnetically hard material to align the domains and create a permanent magnet. However, once the domains have been aligned, the magnetically hard material becomes a permanent magnet with ambient temperature and conditions having little or no disrupting effects on the magnet's properties.

Exemplary magnetically hard materials for use according to the teachings of the present invention include: Cunife, typically comprising 60% copper, 20% nickel and 20% iron, Cunico, typically comprising 50% copper, 20% nickel and 30% cobalt, and Platinum-cobalt, typically comprising 78% platinum and 22% cobalt. The latter material is especially suitable for use in micro-magnets employed in MEMS (i.e., micro-electro-mechanical systems) devices.

The percentages of the elements comprising Cunife can be altered to optimize various magnetic properties of the material, such as the coercive force, residual induction, etc. A magnetically soft form of Cunife can also be formed, thus allowing the formation of complex magnetic circuits employing both hard and soft magnetic materials according to the teachings of the present invention.

As illustrated in the side view of FIG. 6, a substrate 40, comprising conventional printed circuit board material such as FR-4 or ceramic, includes an overlying copper layer 42. The copper layer 42 is patterned and etched to form traces 44 and 46 according to known conventional printed circuit board processing techniques. The resulting structure is illustrated in FIG. 7. Photoresist applied to the traces 44 and 46 during the patterning and etching processes is removed, and the traces 44 may be thoroughly cleaned before formation of the magnetic material over the traces 44, as described below, to ensure a high quality bond between the trace material and the magnetic material.

Figure 8:
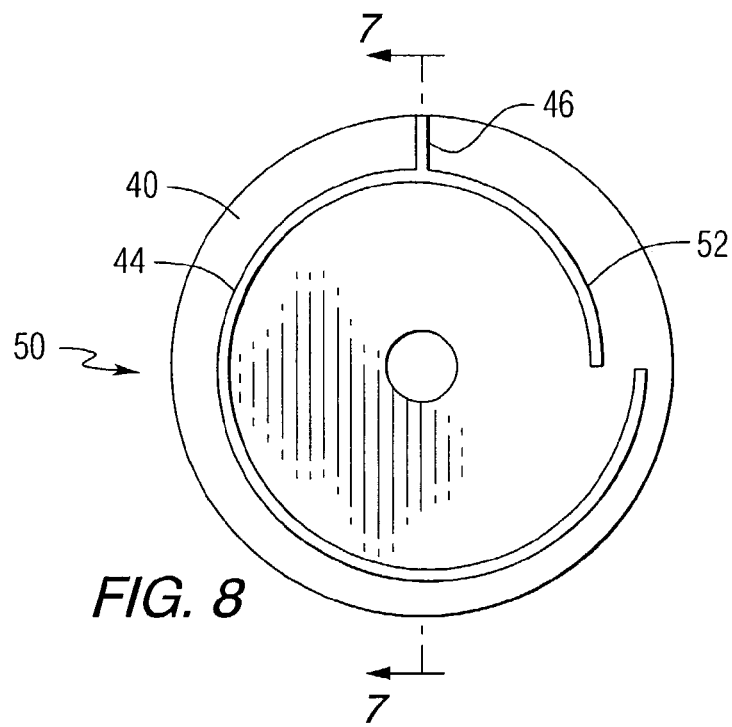

A target 50 formed according to the process steps described in conjunction with FIGS. 6 and 7 is illustrated in FIG. 8, where the cross-section line 7—7 identifies the plane along which FIG. 7 is viewed. Thus the traces 44 represent segments of a spiral target track 52 of the target 50. The trace 46 carries current during the electroplating process for the target 50 as described further below.

In lieu of the copper layer 42, a copper clad ceramic material can also be employed as the copper layer 42. Although the process is described for forming a spiral shaped magnetic target, the process is more generally applicable to any magnetic target size or shape.

Figure 9:
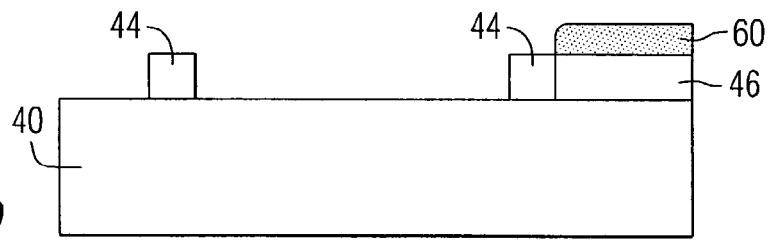

In FIG. 9, a protective polymer coating layer 60 is deposited over the trace 46 to prevent the plating thereof during the subsequent electroplating step. This deposition step can be executed by silk screening or stencil printing techniques that are conventional in printed circuit board processing. In another embodiment, the deposition step can be omitted, but the trace 46 will be then electoplated in the next step and may thus interfere with operation of the magnetic field sensor. In still another embodiment, the polymer layer 60 may not necessarily be required as the trace 46 may be sufficiently distant from the useable portion of the target track 52 such that interference during the sensing process is precluded.

Figure 10:
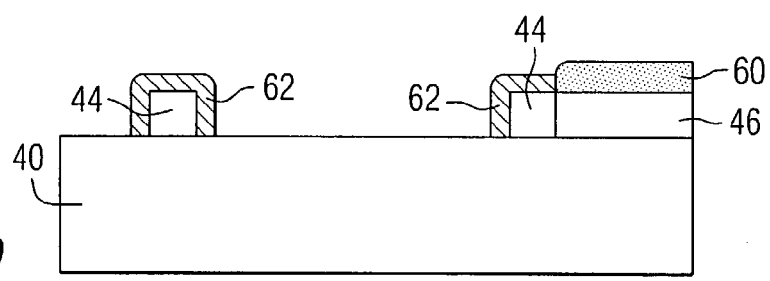

As illustrated in FIG. 10, the traces 44 are electroplated with a layer comprising one of the various permanent magnetic materials described above, or another permanent known magnetic material known in the art. Current for the electroplating process is carried over the trace 46 to the traces 44. As is known to those skilled in the art, the electroplating process is carried out by immersing the substrate 40 in a bath of solution including the magnetic material while supplying the aforementioned current. The electroplating process results in the formation of the magnetic spiral target track 52 illustrated in FIG. 8.

To prevent corrosion and environmental degradation of the magnetic material of the target track 52, a thin passivation barrier layer (not shown in FIG. 10) of chromium, nickel or a polymeric material can be formed over the magnetic material.

Figure 11:
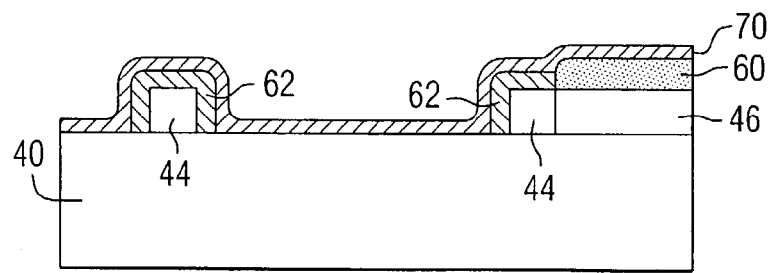

A passivation layer 70, illustrated in FIG. 11 can be applied to the entire target 50 to provide a barrier against harmful environmental effects. Suitable passivation materials include various polymeric compounds.

The magnetic material forming the track 52 is magnetized by the application of a strong magnetizing force. The magnetic material can be magnetized either parallel or perpendicular to the plane of the substrate 40, depending on the characteristics and orientation of the magnetic field sensor that will be employed with the target 50.

Although the process according to the present invention has been explained above in conjunction with the fabrication of a single target track 52, a plurality of such targets, such as the planar complementary magnetic targets 17 and 18 of FIG. 4A, can also be formed in accordance with the inventive techniques.

Figure 12:
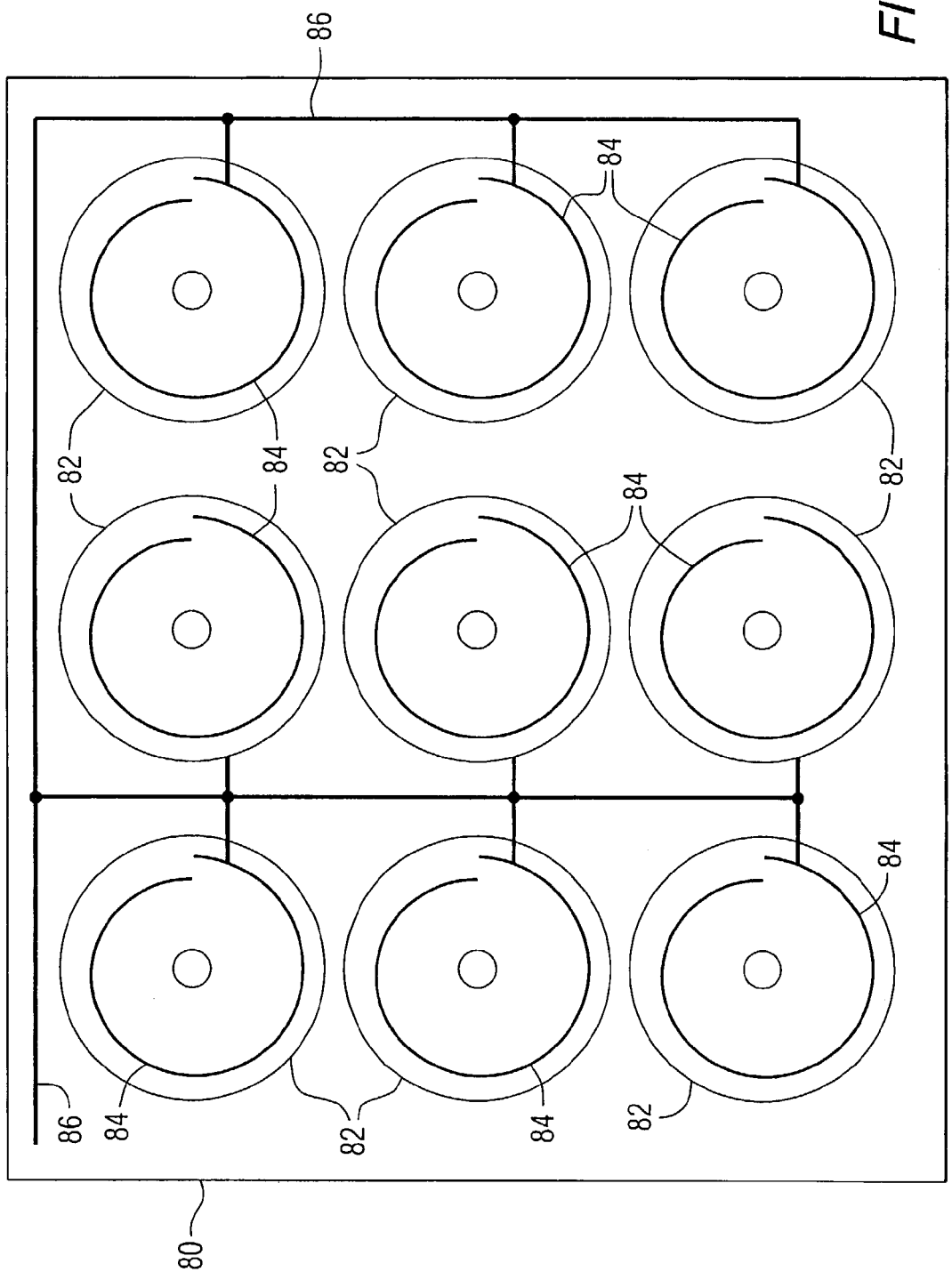
FIG. 12 illustrates a plurality of sensor targets fabricated according to the processing steps of FIGS. 6 through 11.

To improve the efficiency of the fabrication process, a plurality of such targets can be formed simultaneously on a single sheet of substrate material. FIG. 12 illustrates a substrate 80 on which are formed a plurality of targets 82. Although each of the targets 82 is illustrated as having a spiral magnetic target track 84, this is merely exemplary, as any size and shape target or a plurality of target tracks can be formed according to the present invention. Each of the targets 82 and the spiral magnetic target tracks 84 are formed according to the steps set forth in conjunction with FIGS. 6 through 11, including a common conductor 86 electrically connected to the underlying copper trace of each target 82. Current is supplied to the copper traces through the common conductor 86 for electroplating the magnetic material over the copper traces, thereby forming the spiral magnetic target track 84. After formation of the spiral magnetic target tracks 84, the individual targets 82 are singulated.

Figure 13:
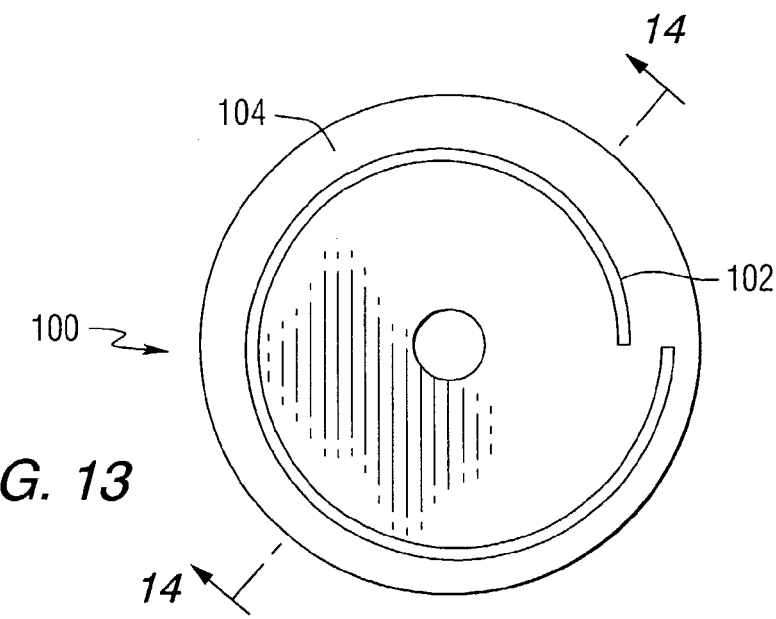
FIGS. 13 through 19 illustrate the processing steps for manufacturing a sensor target according to a second embodiment of the present invention.

FIGS. 13 through 19 illustrate the process steps according to another embodiment of the present invention for forming magnetic targets, specifically an exemplary target 100 of FIG. 13. The target 100 includes a magnetic target track 102 formed on a substrate 104. Although the magnetic target track 102 is shown in the shape of a spiral, this shape is merely exemplary. The cross-sectional views of FIGS. 14 through 19 are taken through the plane 14—14 of FIG. 13.

Figure 14:
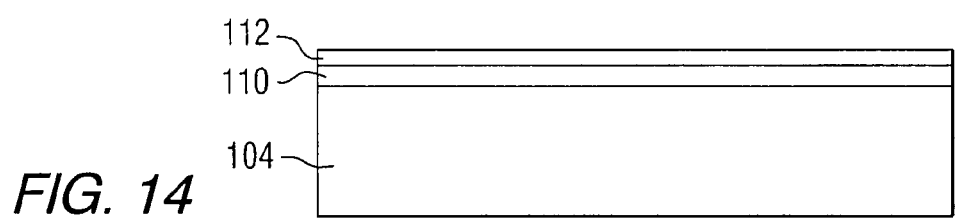
Figure 15:
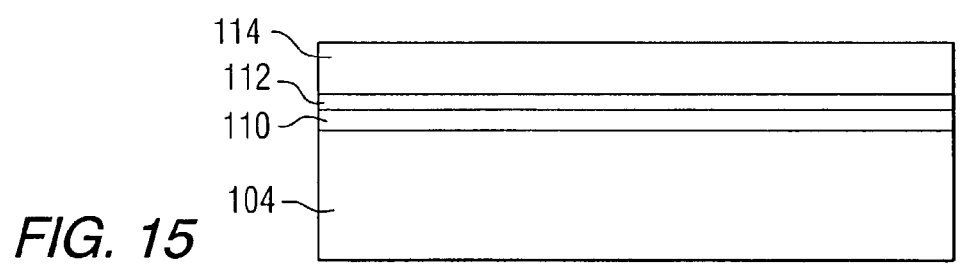

Referring to FIG. 14, the substrate 104, such as FR-4 or ceramic, includes an overlaying copper layer 110. A relatively thin silver layer 112 is formed by any of the well-known deposition techniques over the copper layer 110.

According to the teachings of the present invention, a photoresist layer 114, preferably of photoresist material SU-8 available from MicroChem Corporation of Newton, Mass., is applied over the silver layer 112. See FIG. 15. The SU-8 photoresist has a relatively high mechanical strength in the cross-linked state, i.e., after exposure to ultraviolet light, and can be applied in a layer sufficiently thick to allow the formation of high-aspect ratio targets (i.e., targets that are relatively thick compared to their width dimension). Other photoresist materials are suitable substitutes for SU-8 in the process of the present invention.

A mask 116 is then introduced over the substrate 104, where the mask includes regions of varying opacity that define the desired target shape. Since the SU-8 photoresist material is a negative-acting photoresist, a trench to be formed within the photoresist layer 114 according to the present invention, is defined by opaque regions 118 in the mask 116. As can be seen from the top view of FIG. 13, the magnetic target track 102 is a continuous structure. Thus the cross-sectional view of FIG. 16 illustrates two spaced apart trenches in which the magnetic target track 102 is formed according to subsequent processing steps.

Figure 16:
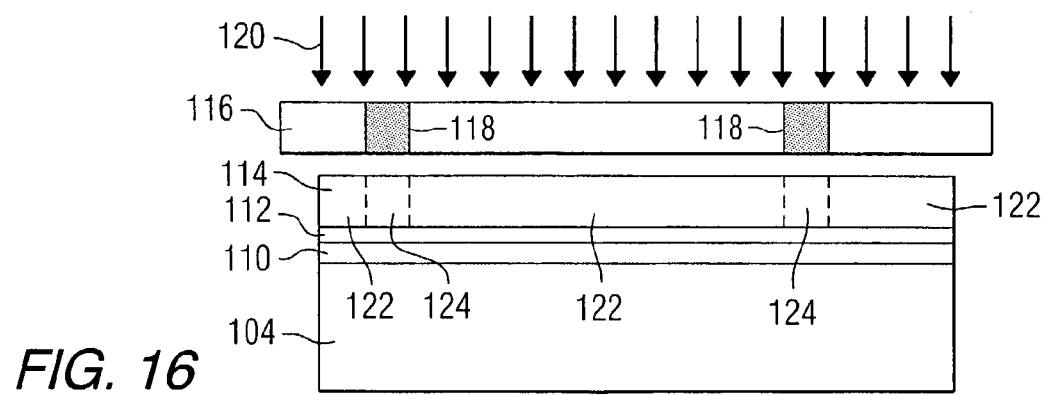

The substrate 104 is exposed to ultraviolet light through the mask 116, as indicated by the arrowheads 120 in FIG. 16. After exposure the photoresist layer is defined by certain exposed regions 122 exposed to the ultraviolet light passing through mask 116, and certain unexposed areas 124 blocked from ultra-violet light by the opaque regions 118. The exposed regions 122 undergo a structural change by being transformed from a relatively soluble state to a relatively insoluble state by the polymerization process caused by ultraviolet light. The unexposed regions 124 remain relatively soluble.

In another embodiment, where a positive-acting photoresist material is used, the target region (i.e., area where the trenches are to be formed) is defined by a transparent region in the mask 116 and the remainder of the mask 116 is opaque.

Figure 17:
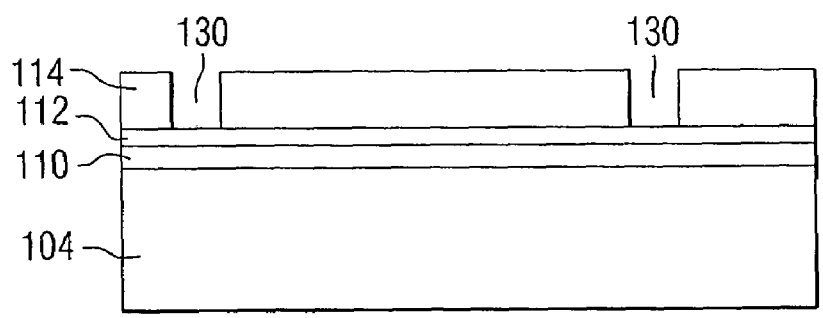
Figure 18:
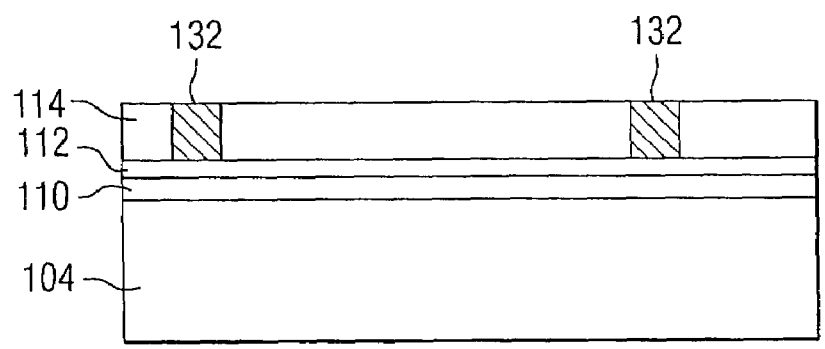

A chemical developing material, such as xylene, is then applied to the substrate 104 to remove the soluble unexposed regions 124, thereby forming trenches 130 in the photoresist layer 114. Although only two trenches are shown in FIG. 17 according to the spiral magnetic track 102 shown in FIG. 13, it is known that any number and size trenches can be formed as dictated by the specific geometry of the target track configurations, such as the target tracks illustrated in FIGS. 1, 2B and 4A.

The substrate 104 is then immersed in a bath of an appropriate magnetic metal for electroplating the magnetic material in the trenches 130. Materials such as Cunife, Cunico, or Platinum-cobalt, as discussed above, are considered suitable candidates.

During the electroplating process, current is supplied to the copper layer 110 or the silver layer 112, such that the silver layer 112 serves as the electroplating electrode, causing the magnetic material in the bath to fill the trenches 130 up from the silver layer 112, thereby forming target track segments 132. See FIG. 18. When viewed from the top view of FIG. 13, the target track segments 132 form the magnetic target track 102. The electroplating process is terminated when the top surface of the magnetic material in the trench 130 reaches the top surface of the photoresist layer 114.

Figure 19:
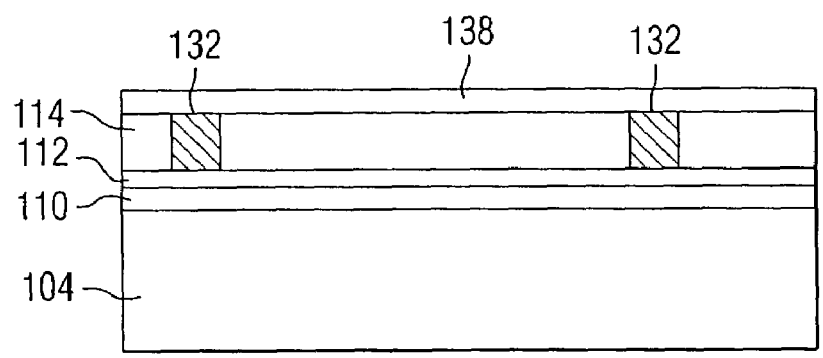

The substrate 104 is removed from the electroplating bath, washed, rinsed and dried. As shown in FIG. 19, a protective passivation layer 138 is disposed over the target track segments 132 and the photoresist layer 114 to provide protection from mechanical and environmental degradation. The passivation layer 138 is formed by, for example, depositing polyimide or a similar polymeric compound. In another embodiment, a second layer of the SU-8 material can be deposited to serve as the passivation layer 138. In yet another embodiment, chromium can be electroplated over the target track segments 132 to form the passivation layer.

As discussed above with respect to the previous embodiment, the magnetic material of the magnetic target track 102 is magnetized by the application of a strong magnetizing force. The magnetic material of the magnetic track 102 can be magnetized either parallel or perpendicular to the plane of the substrate 104, depending on the type and orientation of the magnetic field sensor that will be employed with the target 100.

By forming the magnetic target track within a photoresist trench 130, the trench sidewalls provide mechanical strength and support for the target track. Also, the underlying cooper and silver layers 110 and 112, respectively, provide a firm anchor for the target track. This lateral and underlying support is especially important for narrow target tracks and those having a high aspect ratio, i.e., depth with respect to width.

The silver layer 112 provides mechanical bonding between the cured photoresist layer 114 and the underlying copper layer 110. However, in another embodiment not shown in the Figures, the silver layer 112 is absent. In this embodiment the copper layer 110 is preferably carefully cleaned before application of the photoresist layer 114 to ensure a strong bond between the copper layer 110 and the photoresist layer 114, and also between the copper layer 110 and the later formed magnetic material. In particular, the silver layer 112 may be unnecessary in those embodiments where a photoresist material other than SU-8 is used as the material of the photoresist layer 114.

Figure 20:
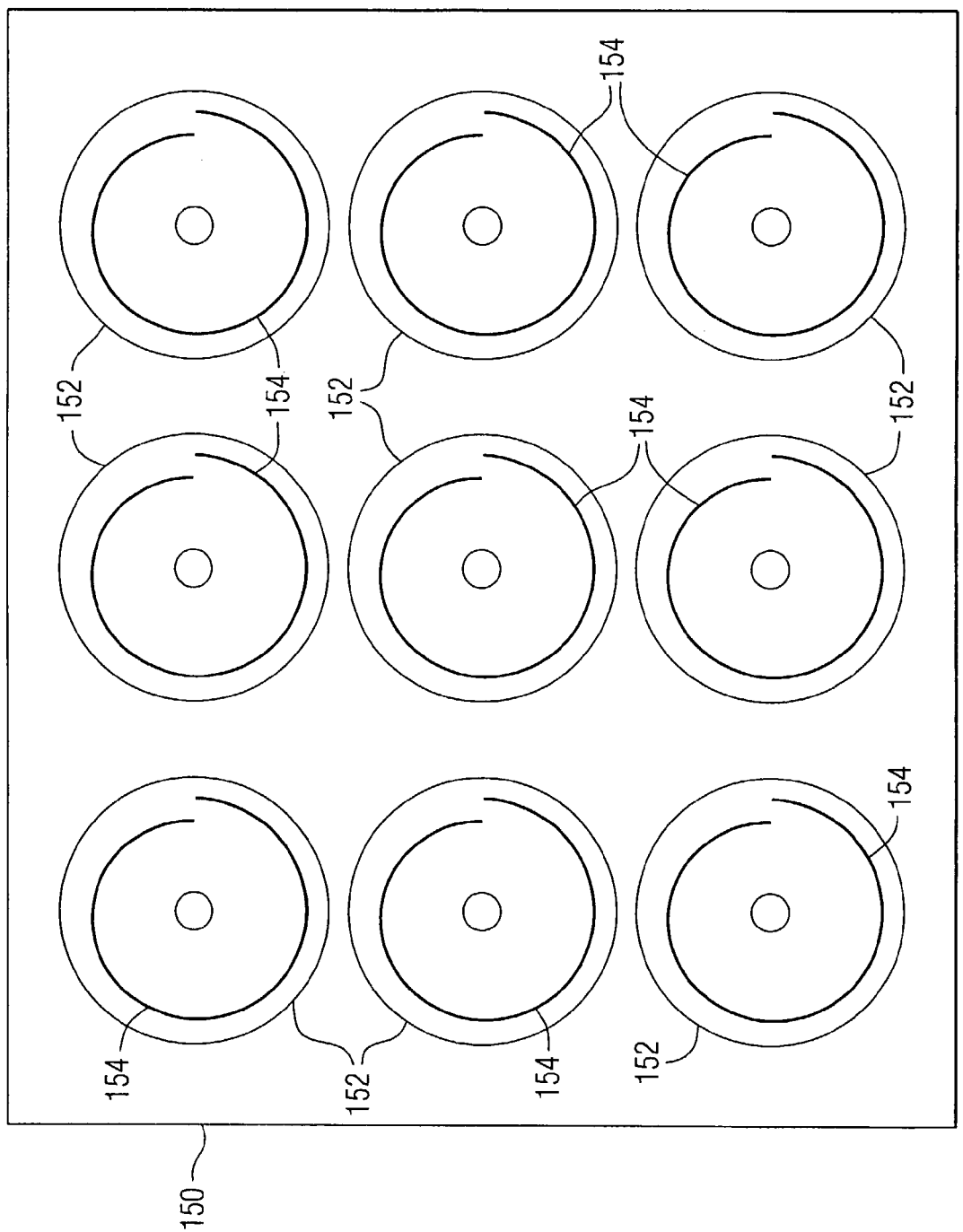
FIG. 20 illustrates a plurality of sensor targets fabricated according to the processing steps of FIGS. 13 through 19.

FIG. 20 illustrates a substrate 150 on which are formed a plurality of targets 152. Although each of the targets 152 is illustrated as having a spiral magnetic target track 154, this is merely exemplary, as any size and shape target can be formed according to this embodiment of the present invention. Each of the plurality of targets 152 and the magnetic target tracks 154 are formed according to the steps set forth in conjunction with FIGS. 14 through 19. As compared to the embodiment with the common conductor 86 as referred to in FIG. 12 above, the common conductor 86 is not required in this embodiment as electroplating current is supplied to deposit magnetic material in the trenches 130 through the copper layer 110 and/or the silver layer 112. After formation of the target tracks 154, the individual targets 152 are singulated.

In another embodiment of the present invention, targets can be fabricated according to yet another process in which the copper cladding on a printed circuit board (such as the copper layer 110 of FIG. 14) is replaced by a cladding of magnetic material, such as Cunife comprising about 60% copper, 20% nickel and 20% iron. The Cunife material, which is available in thin sheets or foils, is a mechanically soft alloy that is further characterized by magnetically hard properties. Hoskins Manufacturing Company of Hamburg, Mich. is a supplier of the material. Cunife is laminated on printed circuit board substrates to form an assembly that can be patterned and etched according to known techniques. Appropriate etchants for these magnetic claddings are known, including ferric chloride ($FeCl_3$).

Figure 21:
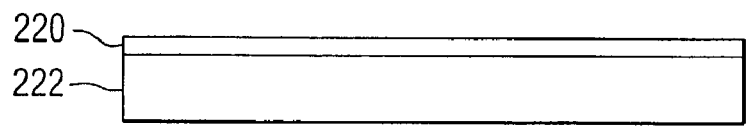
FIGS. 21 through 26 illustrate the processing steps for manufacturing a sensor target according to a third embodiment of the present invention.
Figure 22:
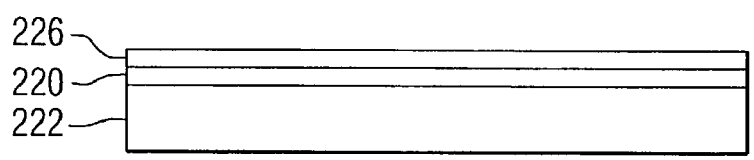

As shown in FIG. 21, a magnetic cladding material layer 220 is disposed over a base material or substrate 222, formed from a rigid polymer, ceramic, printed circuit board base material such as FR-4, or even a non-magnetic metal (e.g., aluminum). The magnetic layer 220 comprises a material capable of exhibiting permanent magnetic properties, such as Cunife referred to above. A conventional photoresist material layer 226 is applied over the magnetic layer 220 as illustrated in FIG. 22.

Figure 23:
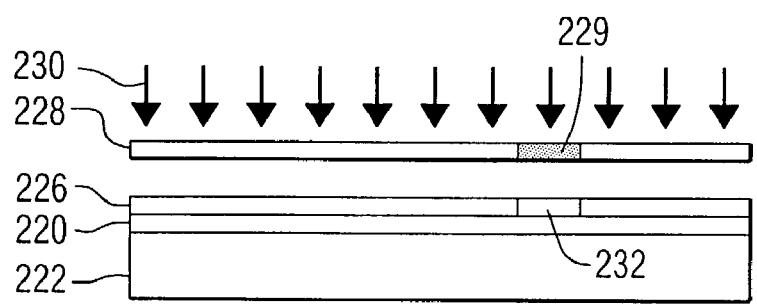

As shown in FIG. 23, a mask 228 is then introduced above the assembly, where the mask 228 includes regions of varying opacity, including an opaque region 229 that defines the desired target shape. The pattern of the mask 228 is transferred to the photoresist material layer 226 according to conventional printed circuit board processing techniques, by curing exposed regions of the photoresist material layer 226 and rendering these exposed regions soluble in a developer. Exposure to ultraviolet light, identified by arrowheads 230, is one known technique for transferring the mask pattern to create an unexposed region 232 in the photoresist material layer 226, where the unexposed region 232 is insoluble in the developer.

Figure 24:
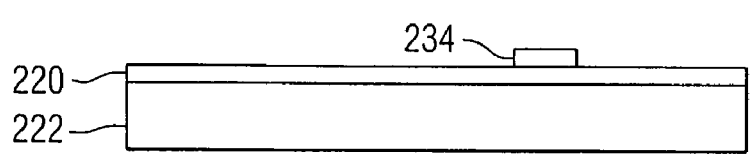
Figure 25:
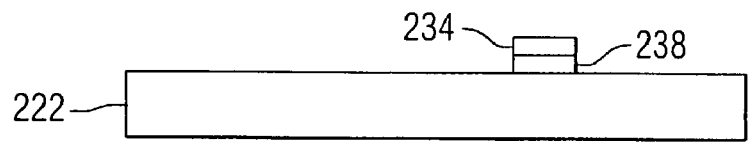
Figure 26:
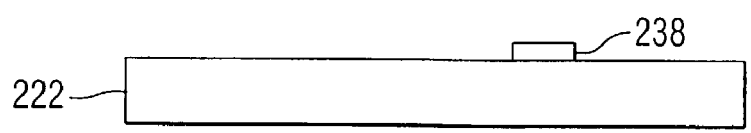

A chemical developer, such as xylene, is applied to the assembly to remove the soluble areas of the photoresist material layer 226, leaving only a photoresist mesa region 234. See FIG. 24. The exposed regions of the magnetic layer 220 (i.e., those regions over which the photoresist material layer 226 has been removed) are removed by use of an appropriate etchant. In the embodiment where the magnetic layer 220 comprises Cunife, a printed circuit board etch chemistry such as ferric chloride ($FeCl_3$.) can be used to remove regions of the magnetic layer 220. After removal of the exposed regions of the magnetic layer 220, a target mesa region 238 remains above the substrate 222. The overlaying photoresist mesa region 234 is then removed, leaving the target mesa region 238 as shown in FIG. 26.

In one embodiment, a passivation layer (not shown in FIG. 26) is preferred to protect the Cunife target from environmental effects. Suitable passivation layer materials include a thin layer of nickel, chromium, or certain polymer materials. Finally, the Cunife target 238 is magnetized as described above.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope thereof. For example, differently sized and shaped targets than those illustrated can be formed according to the teachings of the present invention. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming a target comprising a magnetic target track on an insulator substrate, comprising:
    forming a conductive layer on the insulator substrate;
    disposing a photoresist layer over the conductive layer;
    forming at least one trench in the photoresist layer, wherein the at least one trench defines a geometry of the magnetic target track;
    forming hard magnetic material in the trench; and
    magnetizing the hard magnetic material to form the magnetic target track.

2. The method of claim 1 wherein the material of the conductive layer comprises copper.

3. The method of claim 1 wherein the photoresist layer comprises a negative-acting photoresist.

4. The method of claim 3 wherein the negative acting photoresist comprises SU-8.

5. The method of claim 1 wherein the step of forming the at least one trench further comprises:
    positioning a photolighographic mask over the photoresist layer, wherein the mask includes one or more relatively transparent and one or more relative opaque regions;
    exposing the mask to radiation, causing the regions of the photoresist layer subjected to the radiation to undergo a structural change; and
    etching regions of the mask, wherein the etched regions comprise the regions of the photoresist that did not undergo a structural change to form the at least one trench therein.

6. The method of claim 1 wherein the step of forming the hard magnetic material in the trench comprises immersing the substrate in an electroplating bath of hard magnetic material, providing an electrical current through the conductive layer and electroplating the hard magnetic material in the trench to form the hard magnetic material.

7. The method of claim 1 wherein a plurality of targets are formed simultaneously on a common substrate.

8. The method of claim 7 wherein the conductive layer is common to each of the plurality of targets for receiving electrical current during the electroplating step such that the hard magnetic material is simultaneously formed in the at least one trench of each one of the plurality of targets.

9. The method of claim 7 further comprising singulating the plurality of targets.

10. The method of claim 1 wherein the hard magnetic material is selected from a group consisting of Cunife, Cunico and platinum-cobalt.

11. The method of claim 1 further comprising forming a passivation layer over the target.

12. The method of claim 1 wherein the substrate is attached to a moving object, and wherein a sensor determines one or more of the position, velocity, speed and acceleration of the moving object in response to the magnetic field produced by the magnetic target track.

* * * * *